(12) United States Patent
Knall

(10) Patent No.: US 6,642,603 B1
(45) Date of Patent: Nov. 4, 2003

(54) SAME CONDUCTIVITY TYPE HIGHLY-DOPED REGIONS FOR ANTIFUSE MEMORY CELL

(75) Inventor: N. Johan Knall, Sunnyvale, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/185,515

(22) Filed: Jun. 27, 2002

(51) Int. Cl.[7] .............................................. H01L 29/00
(52) U.S. Cl. ..................................................... 257/530
(58) Field of Search .......................................... 257/530

(56) References Cited

U.S. PATENT DOCUMENTS

| | | | | |
|---|---|---|---|---|
| 5,835,396 A | * | 11/1998 | Zhang .......................... | 365/51 |
| 6,559,516 B1 | * | 5/2003 | Van Brocklin et al. ..... | 257/530 |
| 2003/0003633 A1 | * | 1/2003 | Mei et al. ................... | 438/131 |

* cited by examiner

*Primary Examiner*—David Nelms
*Assistant Examiner*—Tu-Tle Ho
(74) *Attorney, Agent, or Firm*—Blakely, Sokoloff, Taylor & Zafman LLP

(57) ABSTRACT

A memory cell for a 3-D integrated circuit memory is described. An antifuse region is sandwiched between two heavily doped regions of the same conductivity type.

20 Claims, 2 Drawing Sheets

SAME CONDUCTIVITY TYPE HIGHLY-DOPED REGIONS FOR ANTIFUSE MEMORY CELL

REFERENCE TO RELATED APPLICATION

"Memory Cell with Antifuse Layer Formed at Diode Junction," filed Jun. 27, 2002, Ser. No. 10/186,359, and "Electrically Isolated Pillars in Active Devices," filed Jun. 27, 2002, Ser. No. 10/185,507.

FIELD OF THE INVENTION

This invention relates to the field of integrated circuit memory cells, particularly memory cells employing antifuse layers.

PRIOR ART

Three-dimensional memories, including memories with cells having antifuse layers, have been described in several prior art publications. Such publications include U.S. Pat. Nos. 5,835,396; 6,034,882; and PCT/US01/13575, filed Apr. 25, 2001.

In the process of fabricating three-dimensional arrays, improvements to the memory cells have been discovered that enhance the cells performance and manufacturability.

SUMMARY OF THE INVENTION

A memory cell is described having first and second spaced-apart conductors generally fabricated one above the other and preferably at right angles to each other. First and second heavily doped regions, doped with a first conductivity type dopant, are disposed between the conductors with one of the regions coupled to the first conductor. In an alternate embodiment, one of the heavily doped regions can be a conductor. An antifuse region such as a silicon dioxide layer is disposed between the first and second heavily doped regions. A third region of a second conductivity type is in contact with the second doped region and electrically coupled to the second conductor. The junction between the second and third regions form a diode which is part of the memory cell. In one embodiment, at least one of the first and second doped regions is dedicated to a single memory cell and does not extend to, or communicate with, other cells. In a currently preferred embodiment, the first conductivity type dopant is a P type dopant.

DETAILED DESCRIPTION

A memory cell particularly useful in a three-dimensional memory is described. Each of the cells comprise a diode and an antifuse layer disposed between two heavily doped regions of a first conductivity type. In the following description, numerous specific details are set forth, such as specific thicknesses, materials and doping levels, in order to provide a thorough understanding of the present invention. It will be apparent to one skilled in the art that the present invention may be practiced without these specific details. In other instances, well-known fabrication steps are not set forth in order not to unnecessarily obscure the present invention.

Figure 1:
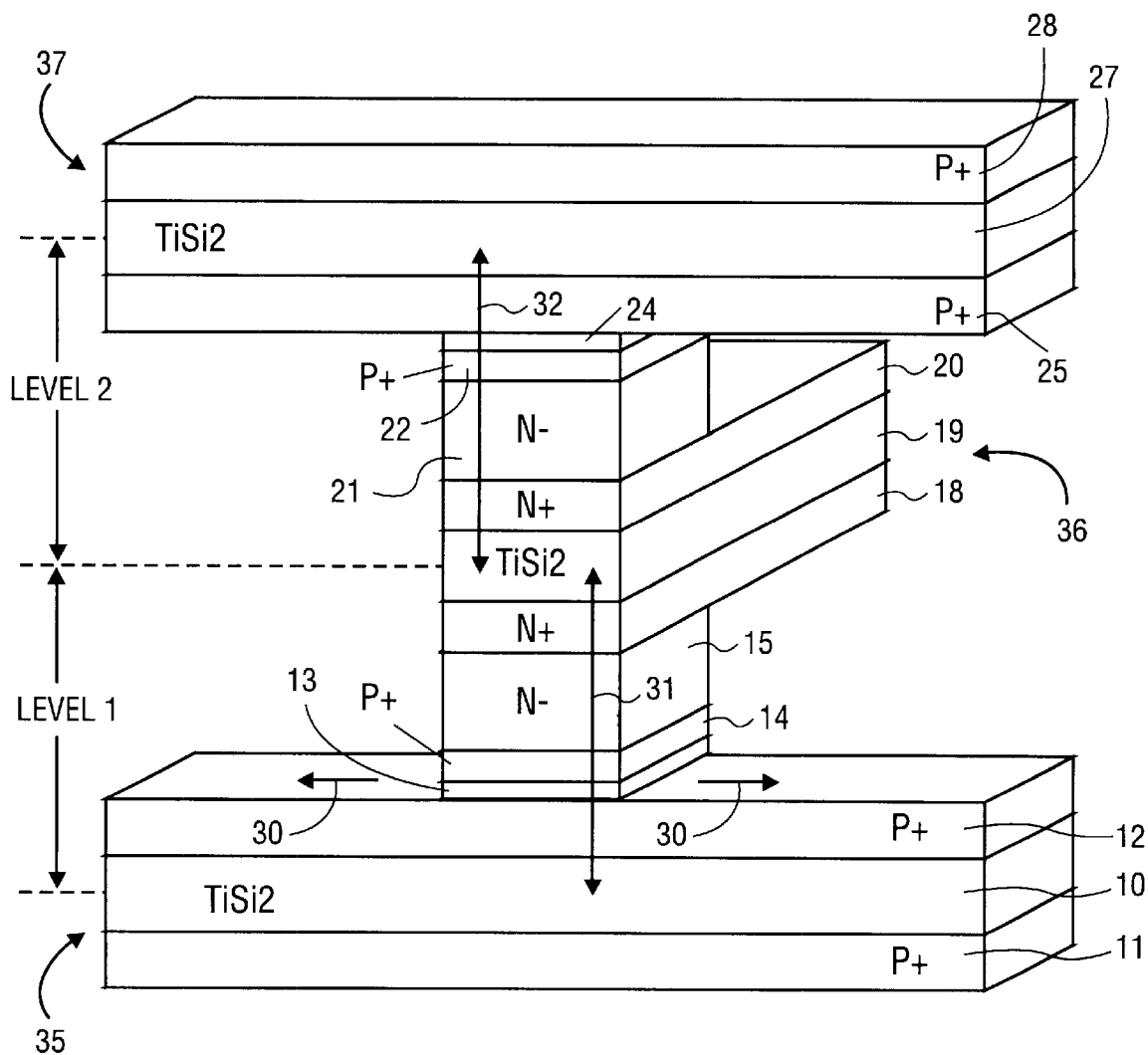
FIG. 1 is a perspective view of an embodiment of memory cells in accordance with the present invention.

Referring now to FIG. 1, in one embodiment of the present invention, the memory cells 31 and 32 are fabricated from rail-stacks 35, 36 and 37. One memory cell is shown on each level, specifically levels 1 and 2. These memory cells 31 and 32, as will be seen, are formed at the intersections of the rail-stacks.

The memory cell 31 at level 1 is disposed between a pair of conductors 10 and 19 formed within the rail-stacks 35 and 36, respectively. These conductors are perpendicular to one another and spaced-apart vertically from one another. Disposed between the conductors is a diode for the memory cell 31 defined by the P+ region 14 and the N− region 15. An antifuse region 13 is formed between two heavily doped P+ regions. One of these regions is the P+ region 12 which is a layer of the rail-stack 35. The other region is the P+ region 14 which is also a layer formed in the rail-stack 35 for the illustrated embodiment. The memory cell also includes the N+ region 18 which provides silicon for forming the silicide of conductor 19 and provides a good conductive contact between the region 15 and the conductor 19. The region 14 is dedicated to the cell 31, in that, unlike region 12, it does not extend to any other cell as will be discussed later.

On level 2, the illustrated memory cell 32 is disposed between conductors 19 and 27. Conductor 27 is formed as part of the rail-stack 37. Again cell 32, like the previously described cell 31, includes an antifuse region 24 disposed between heavily doped P+ regions 22 and 25. A diode is formed by the junction of the P+ region 22 and an N− region 21. The N+ region 20 provides for good conductivity between the diode and the conductor 19.

While not shown, additional cells may be fabricated above and/or below the two cells shown in FIG. 1 from other rail-stacks. Moreover, while only part of a single rail-stack is shown at each of the memory levels, an array in a memory includes a plurality of parallel, spaced-apart, rail-stacks at each level.

The P+ region 11 of rail-stack 35 provides a source of silicon for the conductor 10 and also forms part of a cell when one is fabricated below level 1. Similarly, the P+ region 28 of the rail-stack 37 is for cells fabricated above level 2.

Importantly, as shown for the two memory cells of FIG. 1, the antifuse regions are placed between the heavily doped regions of the same conductivity type. Also, as mentioned, one of the P+ regions for each cell is dedicated to that cell, that is, the P+ region does not extend to, or is part of, another cell. Specifically for cell 31, while region 14 may be initially fabricated from the rail-stack 35, it does not extend in the direction indicated by arrows 30 to other memory cells that are reached through the conductor 10. Similarly, region 22 does not extend in either of the directions of the rail-stacks.

The P+ region 14 is formed on the antifuse layer 13 and etched initially so that it is part of the rail-stack 35. Then, when the rail-stack 36 is formed, the region 14 is again etched in alignment rail-stack 36 so that it does not extend in the direction shown by the arrows 30. In that manner, the region 14 is dedicated to a single cell. This dedicated region prevents a current path to adjacent cells that can make the scanning of cells more difficult.

Similarly, the region 22 is initially formed with the rail-stack 36 and later is etched in a second direction in alignment with rail-stack 37 so that the region 22 does not extend in the direction of the conductor 19.

Consequently, the memory cells 31 and 32 have an antifuse layer which is sandwiched between two heavily doped regions formed from the same conductivity type
} material. For instance, region 24 is sandwiched between the heavily doped P+ regions 22 and 25. At least one of these regions in each cell is dedicated to that cell. These regions are doped with, for instance, boron to a level of at least $1 \times 10^{19}$ atoms $cm^{-3}$, or even to a level in excess of $1 \times 10^{20}$ atoms $cm^{-3}$. It has been found that where the antifuse layer is disposed between these heavily doped regions of the same conductivity type, improved cell performance is obtained. In particular, when the cell is programmed so that the antifuse layer is breached, the cell is more predictably conductive. In the currently preferred embodiment, the heavily doped regions are P+ regions, which the inventor has found to produce the best forward current results.

All the doped regions may be fabricated from layers of polysilicon or other silicon such as an amorphous silicon. The layer 21 may be doped with phosphorous to a level of approximately $1 \times 10^{17}$ atoms per $cm^{-3}$ with a thickness of approximately 2,000 Å. The layer 15 may have the same doping level and may have an initial thickness of 3,500 Å and a final thickness of 2,000–3,000 Å.

The antifuse layer itself may be fabricated from an insulator such as a layer of silicon dioxide. The silicon dioxide may be deposited with a chemical vapor deposition process or may be grown from underlying silicon. The regions 13 and 24 may be grown from regions 12 and 22, respectively. The antifuse layer may have a thickness of approximately 25 Å.

For the embodiment shown in FIG. 1, the layers from which the conductors are formed, specifically conductors 10, 19 and 27, may have a thickness of approximately 500 Å. As shown, in one embodiment, the conductors comprise titanium silicide. Other suicides may be used or other metal alloys may be used. For some embodiments, it may be possible to use polysilicon for the conductors.

The layers 11, 12, 18, 25, and 28 may have a thickness between 500–1,500 Å. The layers 11 and 25 may have an initial thickness of 2,000 Å and a final thickness of 1,000 Å because some of the silicon from these layers is consumed in the formation of the titanium silicide conductors. Layer 18 may have an initial thickness of 1,500 Å and a final thickness of 500 Å, for the same reason. Layer 22 may have an initial thickness of 1,800 Å and a final thickness of 200–1,200 Å, and layer 15 may have an initial thickness of 3,500 Å and a final thickness of 2,000–3,000 Å, with these losses in thickness being due to CMP. The layers 14 and 20 may have a thickness of 300 Å. Layers 11, 12, 14, 22, 25, and 28 may be doped with a dopant such as boron. The layers 18 and 20 may be doped with phosphorous to a level of $1 \times 10^{19}$ atoms $cm^{-3}$ or greater. All the doping may be formed in-situ or by ion implantation.

In the fabrication of a multi-level memory, planarization is often used at each level. The layer which is planarized is generally made initially thicker to allow for the loss of layer thickness, for example, during chemical-mechanical polishing. This is true for layers 15 and 22 of FIG. 1.

Figure 2:
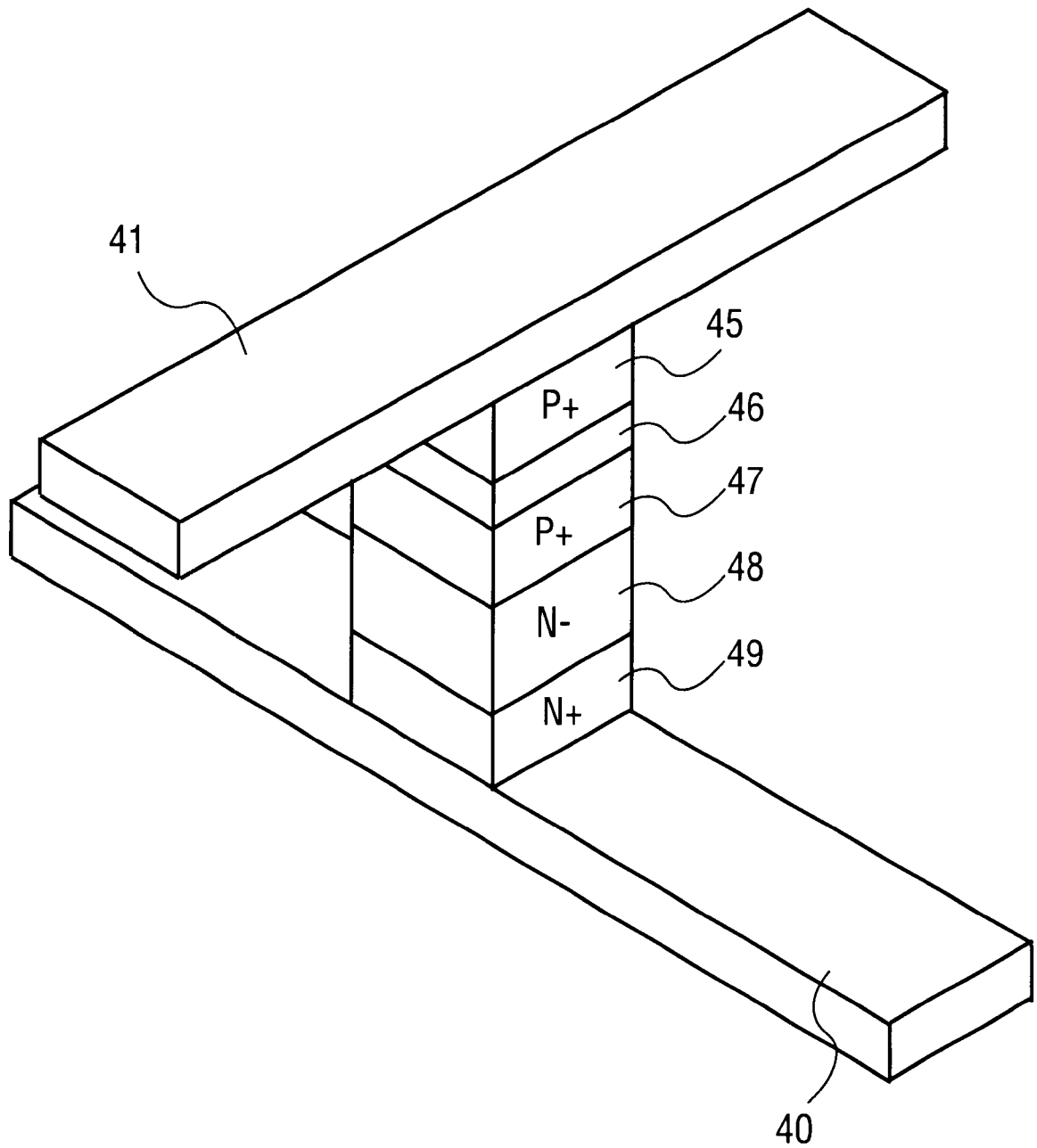
FIG. 2 is a perspective view of another embodiment of a memory cell in accordance with the present invention.

The embodiment of FIG. 2 illustrates a cell disposed between conductors 40 and 41. In FIG. 2, while only a single cell is shown at a single level, it will be appreciated that in the fabrication of a memory a plurality of cells are formed at each level and a plurality of levels are formed above a substrate. The substrate may contain the peripheral circuitry for the memory.

In the embodiment of FIG. 2, the cell is formed in a pillar structure by etching layers, first in one dimension when the conductor 40 is formed, and then in a second direction in alignment with the conductor 41. The conductors 40 and 41 may be metal or silicide layers having the thickness and the composition described in the previous embodiments for the conductors shown there.

The memory cell of FIG. 2 again includes an antifuse layer 46 sandwiched between heavily doped P+ regions 45 and 47. The cell also includes a diode defined by the P+ region 47 and N– region 48. The N+ region 49 is used to provide contact to the conductor 40, and as mentioned earlier, where this conductor is a silicide, silicon from this layer may be used in the formation of a silicide. The thicknesses and doping levels of the regions shown in FIG. 2 may be similar to, or the same as, those discussed previously in conjunction with FIG. 1.

For the embodiment of FIG. 2, both P+ regions 45 and 47 are dedicated to a single cell. In contrast, for the embodiment of FIG. 1, only one of the corresponding regions was dedicated to a single cell.

While in the above embodiments the antifuse region is shown sandwiched between two heavily doped P+ regions, the antifuse layer may be sandwiched between two heavily dopes N+ regions. This can be viewed as splitting the N+ layer in two and inserting the antifuse. Other embodiments are possible. For instance, and N+/P– diode may be used with the antifuse disposed between two N+ regions or two P+ regions.

Thus, a memory cell comprising a diode and an antifuse layer is described where the antifuse layer is sandwiched between two highly doped regions of a first conductivity type. The cell is particularly suitable for use in a thee-dimensional memory array since it lends itself to being fabricated vertically above a substrate.

What is claimed is:

1. A memory cell comprising:

first and second spaced-apart conductors;

first and second heavily doped regions of a first conductivity type, the first region being coupled to the first conductor;

an antifuse region sandwiched between the first and second regions; and a third doped region of a second conductivity type in contact with the second doped region and the second conductor, the first and third regions forming a diode.

2. The memory cell defined by claim 1, wherein the heavily doped regions of the first conductivity type are doped with a P type dopant to a concentration of $1 \times 10^{19}$ atoms $cm^{-3}$ or greater.

3. The memory cell defined by claim 2, wherein the doping level is greater than $1 \times 10^{20}$ atoms $cm^{-1}$.

4. The memory cell defined by claim 1, wherein the heavily doped regions of the first conductivity type are doped with a N type dopant to a concentration of $1 \times 10^{19}$ atoms $cm^{-3}$ or greater.

5. The memory cell defined by claim 4, wherein the doping level is greater than $1 \times 10^{20}$ atoms $cm^{-3}$.

6. The memory cell defined by claim 2, wherein the third doped region is an N– region.

7. The memory cell defined by claim 4, wherein the third doped region is an P– region.

8. The memory cell defined by claim 1, wherein the antifuse region is silicon dioxide region.

9. The memory cell defined by claim 8, wherein the antifuse region is a deposited silicon oxide region.

10. The memory cell defined by claim 8, wherein the antifuse region is a grown silicon dioxide layer.

11. The memory cell defined by claim 2, wherein the antifuse region is a silicon dioxide layer.

12. The memory cell defined by claim 11, wherein the antifuse region is a deposited silicon dioxide layer.

13. The memory cell defined by claim 11, wherein the antifuse region is a grown silicon dioxide layer.

14. The memory cell defined by claim 1, wherein the cell is defined, in part, from rail-stacks.

15. The memory cell defined by claim 1, wherein the first, second, third regions and antifuse region form a pillar structure.

16. In a three-dimensional memory having a plurality of cells formed in a plurality of levels, each cell comprising:

first and second heavily doped regions of a first conductivity type;

an antifuse region sandwiched between the first and second regions;

a third region of a second conductivity type being coupled to the first doped region, the first and third regions forming a diode;

at least one of the first and second regions being a dedicated region for the cell and not providing a conductive path to other cells in the array.

17. The memory array defined by claim 16, wherein the first and second regions are doped with a P type dopant to a doping level of $1 \times 10^{19}$ atoms $cm^{-3}$ or greater.

18. The memory defined by claim 17, wherein the antifuse region is silicon dioxide.

19. The memory defined by claim 18, wherein the silicon dioxide is deposited.

20. The memory defined by claim 18, wherein the silicon dioxide is grown.

* * * * *